US012564074B2

(12) United States Patent
Ewald et al.

(10) Patent No.:  US 12,564,074 B2
(45) Date of Patent:  Feb. 24, 2026

(54) POWER ELECTRONICS MODULE

(71) Applicant: ZF Friedrichshafen AG,
Friedrichshafen (DE)

(72) Inventors: Ake Ewald, Bayreuth (DE); Stefan Hain, Speichersdorf (DE)

(73) Assignee: ZF Friedrichshafen AG,
Friedrichshafen (DE)

( * ) Notice: Subject to any disclaimer, the term of this patent is extended or adjusted under 35 U.S.C. 154(b) by 393 days.

(21) Appl. No.: 18/363,311

(22) Filed: Aug. 1, 2023

(65) Prior Publication Data

US 2024/0038638 A1     Feb. 1, 2024

(30) Foreign Application Priority Data

Aug. 1, 2022   (DE) .......................... 102022207925.6

(51) Int. Cl.
*H01L 23/495*     (2006.01)
*H01L 23/31*     (2006.01)
*H01L 23/373*     (2006.01)
*H01L 25/07*     (2006.01)

(52) U.S. Cl.
CPC .... *H01L 23/49562* (2013.01); *H01L 23/3107* (2013.01); *H01L 23/3735* (2013.01); *H01L 25/072* (2013.01)

(58) Field of Classification Search
CPC ........... H01L 23/49562; H01L 23/3107; H01L 23/49524; H01L 23/49541
USPC ........................................................ 257/666
See application file for complete search history.

(56) References Cited

U.S. PATENT DOCUMENTS

2015/0270207 A1*  9/2015  Kim ........................ H01L 25/50
257/676

FOREIGN PATENT DOCUMENTS

JP     2010-157565 A     7/2010

OTHER PUBLICATIONS

Office Action dated Mar. 21, 2023 for German Patent Application No. 10 2022 207 925.6 (26 pp.), note: pp. 1 and 2 are English language Explanations to Section C. Result of Determination Document.

* cited by examiner

*Primary Examiner* — Quoc D Hoang
(74) *Attorney, Agent, or Firm* — Crowell & Moring LLP

(57)     ABSTRACT

A power electronics module, having a PCB having power semiconductors arranged on connecting regions of an uppermost layer of said PCB, wherein the PCB has a preset dimension to arrange a preset maximum number of power semiconductors thereon. A lead frame arranged above the power semiconductors provides three-dimensional power and control routing, and includes a drain-source connection to connect to a drain-source contact of the PCB, and a load-source connection opposite the drain-source connection via the power semiconductors that is formed from a plurality of subregions, each of which can be brought into electrical contact with the power semiconductors, and a gate- and kelvin-source terminal, which are arranged above the load-source connection and have been brought into electrical contact with the power semiconductors. At least one dummy chip consisting of an electrically nonconductive material is arranged on each of the connecting regions that are not populated by power semiconductors.

14 Claims, 1 Drawing Sheet

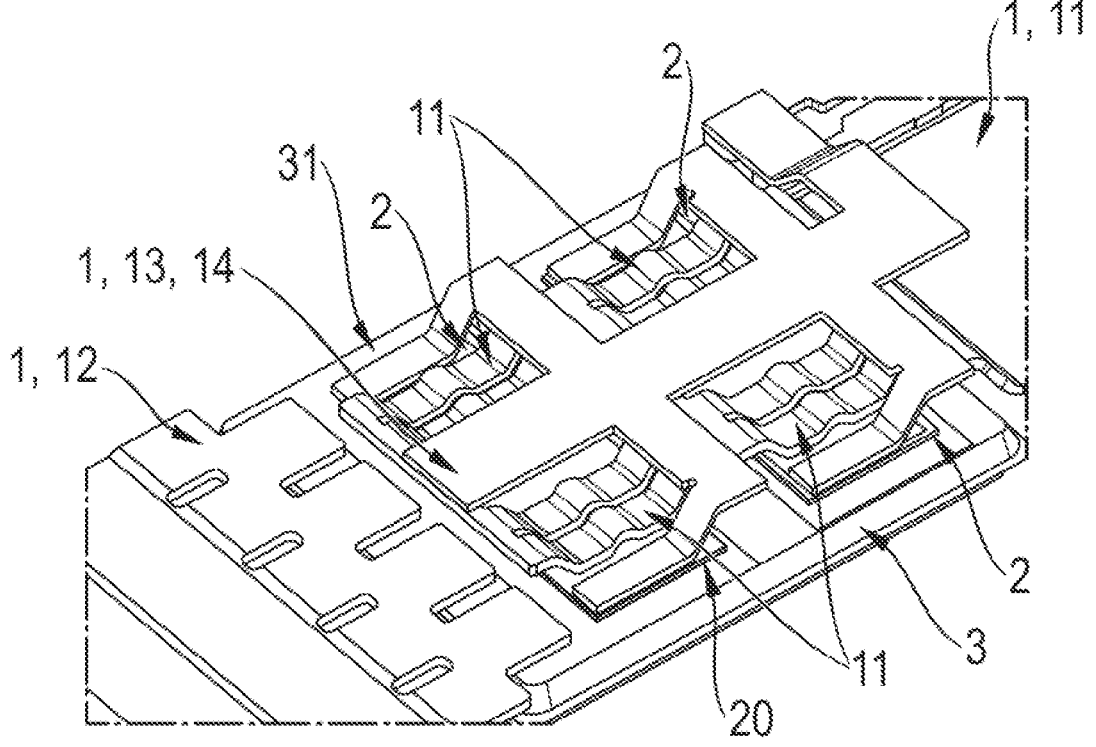

POWER ELECTRONICS MODULE

CROSS-REFERENCE TO RELATED APPLICATION

This application claims priority to German Application No. DE 10 2022 207 925.6, filed on Aug. 1, 2022, the entirety of which is hereby fully incorporated by reference herein.

FIELD

The present invention relates to the field of electromobility, in particular of electronics modules.

BACKGROUND AND SUMMARY

The use of electronics modules, for example power electronics modules, in motor vehicles has increased significantly in recent decades. This can be attributed firstly to the need to improve the fuel saving and the vehicle performance and secondly to the advances in semiconductor technology.

In order to be able to provide the energy, a multiplicity of electronics component parts is required with which, for example, bridge circuits (for example half-bridges) are realized, for example semiconductor power switches, which are also referred to as power semiconductors. Power semiconductors can be installed in complete power electronics modules (also referred to as power modules) or as discrete component parts.

Power electronics modules have a printed circuit board having power semiconductors arranged thereon which have been brought into electrical contact with one another on the printed circuit board for power and control routing. So-called lead frames, i.e. metal line carriers, for producing electrical connections to the inside and to the outside are also already available.

In order to achieve a variation in the power of the power electronics module, at present the chip size/number is changed or dummy chips (which are not functional) consisting of the semiconductor material used for the power semiconductors are used or the lead frame is adapted within the corresponding range. Since all of these options are not optimal, the invention is based on the object of providing a power electronics module by means of which an improved variation in its power can be achieved. This object is achieved by the features of the independent claims. Advantageous configurations are the subject matter of the dependent claims.

What is proposed is a power electronics module, having a printed circuit board having power semiconductors arranged on connecting regions of an uppermost layer of said printed circuit board, wherein the printed circuit board has a preset dimension in order to arrange a preset maximum number of power semiconductors thereon. In addition, a lead frame arranged above the power semiconductors is provided for three-dimensional power and control routing, wherein the lead frame has the following parts: a drain-source connection, which can be brought into electrical contact with a drain-source contact of the printed circuit board, and a load-source connection which is opposite the drain-source connection via the power semiconductors and is formed from a plurality of subregions, each of which can be brought into electrical contact with one of the power semiconductors, and in each case one gate- and kelvin-source terminal, which are arranged above the load-source connection and have been brought into electrical contact with the power semiconductors. In the case where a number of power semiconductors which does not correspond to the maximum number is to be arranged on the printed circuit board, a dummy chip consisting of an electrically nonconductive material is arranged on each of the connecting regions of the uppermost layer which are not populated by the power semiconductors.

In one embodiment, the dummy chip is formed from glass, a plastic or a ceramic.

In one embodiment, the dummy chip is provided on preset regions thereof with a coating which is configured to act as connecting layer for fastening the corresponding parts of the lead frame.

In one embodiment, the dimension of the dummy chip(s) is selected in such a way that it corresponds to the dimension of the power semiconductors. Alternatively, the dimension of the dummy chip(s) is selected in such a way that it provides a required insulating clearance between existing potentials and that fastening of the corresponding parts of the lead frame can take place.

In one embodiment, the printed circuit board is in the form of a DBC printed circuit board.

In one embodiment, the printed circuit board, the power semiconductors, the dummy chip(s) and those parts of the lead frame and the load source connection which are arranged in the region of the printed circuit board are surrounded by a casting compound.

In addition, the use of the power electronics module for driving the electric drive of a vehicle equipped with an electric drive is provided. In addition, an electric drive of a motor vehicle is provided, having the power electronics module which is formed for driving the electric drive. Likewise, a motor vehicle is provided having the electric drive.

Further features and advantages of the invention will become apparent from the following description of exemplary embodiments according to the invention with reference to the figures of the drawing, which shows the details of the invention, and from the claims. The individual features may each be implemented on their own or together in any desired combination in one variant of the invention.

Preferred embodiments of the invention will be explained in more detail below with reference to the appended drawing.

BRIEF DESCRIPTION OF THE DRAWINGS

FIG. 1 shows a basic design of a power electronics module in accordance with one embodiment of the present invention.

DETAILED DESCRIPTION

As already mentioned at the outset, in current power electronics modules the power is varied, for example, via a change in the chip size and/or the chip number. In this case, the omission of a power semiconductor can be implemented comparatively easily by omission of the corresponding bond wires. In a lead frame design, the omission of a power semiconductor usually results in an insulation problem since the gap between the lead frame and the printed circuit board, which is generally in the form of DBC, (which have different potentials) is only approximately 0.1 mm. In this gap, the mold cannot provide the required insulation. For this reason, in such power electronics modules the semiconductor size is often varied in order to enable the scaling.

Alternatively, dummy chips (which are not functional) consisting of the semiconductor material used for the power semiconductors are used or the lead frame needs to be adapted in this region, which results in complex qualification and manufacture, however.

In order to be able to provide a variation in the power of the power electronics module, in accordance with the invention a power electronics module is proposed which has a printed circuit board 3 having power semiconductors 2 arranged on connecting regions of an uppermost layer 31 of said printed circuit board 3. The printed circuit board 3 has a preset dimension (thickness, length and width) in order to arrange a preset maximum number of power semiconductors 2 thereon. In FIG. 1, this is four power semiconductors 2.

The printed circuit board 3 is advantageously in the form of a DBC (direct bonded copper) printed circuit board 3, also referred to below as DBC 3 for short. Power semiconductors 2 which are brought into electrical contact via corresponding connections (bonds, soldered joints, etc.) for power and control routing are arranged on the DBC printed circuit board 3.

In addition, a lead frame 1 arranged above the power semiconductors 2 for three-dimensional power and control routing is provided. This consists of a plurality of parts, one of which is a drain-source connection 12 which can be brought into electrical contact with a drain-source contact of the printed circuit board 3. A further part is a load-source connection 11 which is formed from a plurality of subregions, each of which can be brought into contact with one of the power semiconductors 2. A further part is in each case one gate-source terminal 13 and one kelvin-source terminal 14 in order to bring the power semiconductors 2 into electrical contact with gate-source pins and kelvin-source pins located outside the DBC printed circuit board 3.

The concept according to the invention is characterized by the fact that, in the case of a power electronics module in which not all of the provided connecting regions of the uppermost layer 31 are populated in order to provide a preset power, a dummy chip 20 consisting of an electrically nonconductive material is arranged on the empty connecting region.

The material from which the dummy chip 20 is formed is advantageously glass, but can also be a plastic or a ceramic. It is important that the insulating clearances between the different potentials (lead frame 1 and printed circuit board 3) are maintained.

The dummy chip 20 advantageously has a dimension (thickness, length and width) which corresponds to the dimension (thickness, length and width) of the power semiconductors 2 arranged on the printed circuit board 3. Alternatively, it can also be smaller or larger (length and/or width) as long as the required insulating clearances between the different potentials (lead frame 1 and printed circuit board 3) are maintained and those parts of the lead frame 1 which provide the load-source connection 11 and the gate- and kelvin-source terminals 13, 14 can be fastened thereto. For this purpose, the dummy chip 20 in one configuration is coated with a suitable connecting layer.

In particular if the dummy chip 20 is formed from glass, it is possible, in a relatively simple manner, to apply a coating which provides a surface on which the corresponding parts of the lead frame 1 can be fastened with and in the same process as to the power semiconductors 2.

In all embodiments, at least in the region of the printed circuit board 3 on which the power semiconductors 2 and the dummy chip(s) 20 are arranged, an electrically insulating compound can be provided which can also act as heat dissipation. Such a casting or mold compound can be a resin or another compound which is introduced into the power electronics module and cured during the production process. The casting or mold compound in this case flows into all free regions and also acts as mechanical stabilization of the individual components during fitting.

The term power semiconductor 2 includes both individual topological switches and half-bridges/B6 bridges in order to provide an inverter. The lead frame 1 is advantageously formed from an electrically conductive metal sheet which is suitable for stamping and bending.

A power electronics module within the scope of this invention is used for operating an electric drive of a motor vehicle driven by means of a rechargeable battery fuel cell. The motor vehicle is in particular a utility vehicle such as an HGV or a bus or a passenger car. The power electronics module comprises an inverter. It can also comprise a rectifier, a DC/DC converter, a transformer and/or another electrical converter or part of such a converter or some of these. In particular, the power electronics module serves to supply current to an electric machine, for example an electric motor and/or a generator. An inverter is preferably used to generate a polyphase alternating current from a direct current generated by means of a DC voltage of an energy source, for example a battery. A DC/DC converter is used, for example, to convert (step up) a direct current coming from a fuel cell into a direct current that can be used by the drive.

DC/DC converters and inverters for electric drives of motor vehicles, in particular passenger cars and utility vehicles, such as buses, are configured for the high-voltage range and are in particular configured in a blocking voltage class of above approximately 650 volts.

The described inverter arrangement can be used, for example, in motor vehicles. The motor vehicle can in particular have an axle driven electrically by the electric drive. The motor vehicle can in principle be in the form of a purely combustion engine-based motor vehicle, a hybrid motor vehicle or an electric vehicle.

LIST OF REFERENCE SIGNS 1 lead frame
11 load-source connection
12 drain-source connection
13, 14 gate- and kelvin-source terminal
2 power semiconductor
20 dummy chip
3 DBC printed circuit board
31 connecting regions of an uppermost layer of 3

The invention claimed is:
1. A power electronics module comprising:
a printed circuit board comprising power semiconductors arranged on connecting regions of an uppermost layer of said printed circuit board, wherein the printed circuit board has a preset dimension in order to arrange a preset maximum number of power semiconductors thereon; and
a lead frame arranged above the power semiconductors for three-dimensional power and control routing, wherein the lead frame comprises:
a drain-source connection that is configured to be brought into electrical contact with a drain-source contact of the printed circuit board;
a load-source connection that is opposite the drain-source connection via the power semiconductors and that is formed from a plurality of subregions, each of which is configured to be brought into electrical contact with one of the power semiconductors; and in each case, a gate-source terminal and a kelvin-source terminal, which are each arranged above the load-source connection and are in electrical contact with the power semiconductors; and at least one dummy chip consisting of an electrically nonconductive material arranged on each of the connecting regions of the uppermost layer which are not populated by the power semiconductors.

2. The power electronics module according to claim 1, wherein the at least one dummy chip is formed from glass, a plastic, or a ceramic.

3. The power electronics module according to claim 2, wherein the at least one dummy chip is provided on preset regions thereof with a coating that is configured to act as connecting layer for fastening to corresponding parts of the lead frame.

4. The power electronics module according to claim 3, wherein a size of the at least one dummy chip corresponds to a dimension of the power semiconductors.

5. The power electronics module according to claim 2, wherein a size of the at least one dummy chip corresponds to a dimension of the power semiconductors.

6. The power electronics module according to claim 1, wherein the at least one dummy chip is provided on preset regions thereof with a coating that is configured to act as connecting layer for fastening to corresponding parts of the lead frame.

7. The power electronics module according to claim 1, wherein a size of the at least one dummy chip corresponds to a dimension of the power semiconductors.

8. The power electronics module according to claim 6, wherein a size of the at least one dummy chip corresponds to a dimension of the power semiconductors.

9. The power electronics module according to claim 1, wherein a size of the at least one dummy chip provides a required insulating clearance between existing potentials, and fastening to corresponding parts of the lead frame can take place.

10. The power electronics module according to claim 1, wherein the printed circuit board is in the form of a direct bonded copper (DBC) printed circuit board.

11. The power electronics module according to claim 1, wherein the printed circuit board, the power semiconductors, the at least one dummy chip, and parts of the lead frame that are arranged in the region of the printed circuit board are surrounded by a casting compound.

12. The use of a power electronics module according to claim 1 for driving an electric drive of a vehicle equipped with the electric drive.

13. An electric drive of a motor vehicle, comprising:

the power electronics module according to claim 1 which is configured for driving the electric drive.

14. A motor vehicle, comprising the electric drive according to claim 13.

* * * * *